United States Patent
Cai et al.

(10) Patent No.: US 10,204,028 B2
(45) Date of Patent: Feb. 12, 2019

(54) RULE SPACES AND ARCHITECTURE ROOT DETECTION

(71) Applicant: Drexel University, Philadelphia, PA (US)

(72) Inventors: Yuanfang Cai, Paoli, PA (US); Lu Xiao, Philadelphia, PA (US)

(73) Assignee: Drexel University, Philadelphia, PA (US)

( * ) Notice: Subject to any disclaimer, the term of this patent is extended or adjusted under 35 U.S.C. 154(b) by 0 days.

(21) Appl. No.: 14/916,691

(22) PCT Filed: Sep. 19, 2014

(86) PCT No.: PCT/US2014/056486
§ 371 (c)(1),
(2) Date: Mar. 4, 2016

(87) PCT Pub. No.: WO2015/042357
PCT Pub. Date: Mar. 26, 2015

(65) Prior Publication Data
US 2016/0203071 A1 Jul. 14, 2016

Related U.S. Application Data

(60) Provisional application No. 61/880,289, filed on Sep. 20, 2013.

(51) Int. Cl.
*G06F 9/44* (2018.01)
*G06F 11/30* (2006.01)
(Continued)

(52) U.S. Cl.
CPC .......... *G06F 11/3616* (2013.01); *G06F 8/433* (2013.01); *G06F 8/71* (2013.01);
(Continued)

(58) Field of Classification Search
CPC ... G06F 8/71; G06F 8/433; G06F 8/33; G06F 8/36; G06F 8/74; G06F 8/20; G06F 8/77;
(Continued)

(56) References Cited

U.S. PATENT DOCUMENTS 6,574,788 B1 * 6/2003 Levine ................ G06F 17/5068
716/102
7,124,060 B1 * 10/2006 Eriksson ............. G06F 11/0718
702/185

(Continued)

OTHER PUBLICATIONS

Sunny Wong et al., Detecting Software Modularity Violations, May 21-28, 2011, ACM 978-1-4503-0445-0, [Retrieved on Jul. 18, 2017]. Retrieved from the internet: <URL: http://dl.acm.org/citation.cfm?id=1985850> 10 Pages (411-420).*

(Continued)

*Primary Examiner* — Anibal Rivera
(74) *Attorney, Agent, or Firm* — Baker & Hostetler LLP

(57) ABSTRACT

Errors in software may be detected via the use of design rule spaces and architecture root detection. Design rule spaces may reveal multiple overlapping modular structures of a software system, and reveal structural relations among error-prone files and structural problems contributing to error-proneness. Root detection may extract a few groups of architecturally connected files, which may be connected through problematic architecture relations that propagate errors among these files, and thus influence system error-proneness. The root detector may locate the core architecturally connected file groups that contribute to the error-proneness of a system. The root detection process may, beginning with a set of error-prone files, search and link other files that are architecturally related. The output of the root detection process may be a set of design rule spaces ordered by the number of error-prone contained therein.

21 Claims, 15 Drawing Sheets

Package Clustering

(51) Int. Cl.
*G06F 17/00* (2006.01)
*G06F 11/36* (2006.01)
*G06F 8/41* (2018.01)
*G06F 8/71* (2018.01)
*G06F 17/50* (2006.01)
*G06F 8/36* (2018.01)

(52) U.S. Cl.
CPC ............ *G06F 11/3604* (2013.01); *G06F 8/36* (2013.01); *G06F 11/3608* (2013.01); *G06F 11/3692* (2013.01); *G06F 17/5068* (2013.01)

(58) Field of Classification Search
CPC ............... G06F 17/50; G06F 17/30345; G06F 17/5068; G06F 11/0718; G06F 11/36; G06F 11/30; G06F 11/07; G06F 9/44; G06F 17/30675; G06F 17/30067; G06F 17/30; G06F 11/3616; G06F 11/3608; G06F 11/3692; G06F 11/3688; G06F 11/327
See application file for complete search history.

(56) References Cited

U.S. PATENT DOCUMENTS

| | | | | |
|---|---|---|---|---|
| 8,336,034 | B2* | 12/2012 | Sinha | G06F 11/3608 714/38.1 |
| 8,533,659 | B2* | 9/2013 | Joukov | G06F 11/3692 717/101 |
| 8,910,120 | B2* | 12/2014 | Srinivasa | G06F 9/44 717/124 |
| 9,268,665 | B2* | 2/2016 | Barrow | G06F 8/77 |
| 2004/0162834 | A1* | 8/2004 | Aono | G06F 17/30675 |
| 2008/0189308 | A1* | 8/2008 | Sangal | G06F 8/20 |
| 2009/0216810 | A1* | 8/2009 | Shibata | G06F 17/30067 |
| 2010/0050156 | A1* | 2/2010 | Bonanno | G06F 8/71 717/122 |
| 2011/0016347 | A1* | 1/2011 | Brodeur | G06F 11/327 714/2 |
| 2011/0107318 | A1* | 5/2011 | Kumar | G06F 11/3688 717/168 |
| 2011/0219360 | A1* | 9/2011 | Srinivasa | G06F 17/30 717/124 |
| 2013/0031423 | A1* | 1/2013 | Barrow | G06F 11/3616 714/47.2 |
| 2013/0110879 | A1* | 5/2013 | Winternitz | G06F 17/30345 707/792 |
| 2013/0219362 | A1* | 8/2013 | Cai | G06N 5/00 717/123 |
| 2013/0262039 | A1* | 10/2013 | Barnes | G06F 17/50 703/1 |
| 2014/0013297 | A1* | 1/2014 | Cook | G06F 8/33 717/105 |

OTHER PUBLICATIONS

B Ashok et al., DebugAdvisor: A Recommender System for Debugging, Aug. 23-28, 2009, [Retrieved on Jul. 27, 2018]. Retrieved from the internet: <URL: https://www.microsoft.com/en-us/research/wp-content/uploads/2016/02/esec099-ashok.pdf> 10 Pages (1-10) (Year: 2009).*
Thomas G. Lane, A Design Space and Design Rules for User Interface Software Architecture, Nov. 1990, [Retrieved on Jul. 27, 2018]. Retrieved from the internet: <URL: https://resources.sei.cmu.edu/asset_files/TechnicalReport/1990_005_001_15875.pdf> 63 Pages (1-63) (Year: 1990).*
Richard W. Selby, Analyzing Error-Prone System Structure, 1991 IEEE, [Retrieved on Jul. 27, 2018]. Retrieved from the internet: < URL: https://resources.sei.cmu.edu/asset_files/TechnicalReport/1990_005_001_15875.pdf> 12 Pages (141-152) (Year: 1991).*
Selby et al.; "Analyzing Error-Prone System Structure"; IEEE Transactions on Software Engineering; vol. 17 No. 2; Feb. 1991; p. 141-152.
Lane; "A Design Space and Design Rules for User Interface Software Architecture"; Technical Report CMU/SEI-90-TR-22; School of Computer Science; Nov. 1990; 63 pages.
International Patent Application No. PCT/US2014/056486; Int'l Preliminary Report on Patentability; dated Mar. 31, 2016; 6 pages.

* cited by examiner

FIG. 1

Package Clustering

|   | 1 | 2 | 3 | 4 | 5 | 6 | 7 | 8 | 9 | 10 | 11 | 12 | 13 |
|---|---|---|---|---|---|---|---|---|---|----|----|----|----|
| 1 mij.io.InputPipe | (1) | | | | | | | | | | | | |
| 2 mij.io.OutputPipe | | (2) | | | | | | | | | | | |
| 3 mij.io.MemoryBuffer | | | (3) | | | | | | | | | | |
| 4 mij.lex.LexType | | | | (4) | | | | | | | | | |
| 5 mij.lex.Lexeme | | | | ag | (5) | | | | | | | | |
| 6 mij.ast.Node | | | | | ag | (6) | | | | | | | |
| 7 mij.bnf.LexExpr | | | | | ag | | (7) | | | | | | |
| 8 mij.io.MemoryOutputPipe | | | ag | | | | | (8) | | | | | |
| 9 mij.io.MemoryInputPipe | | | ag | | | | | | (9) | | | | |
| 10 mij.Interpreter | ag | ag | | | | | | | | (10) | | | |
| 11 mij.parse.Convert | | | | | | ag | | | | | (11) | | |
| 12 mij.lex.Lexer | ag | | | | | | ag | | | | | (12) | |
| 13 mij.parse.Parser | | | | | | | ag | | | | | | (13) |

Aggregate DR Space

FIG. 3

|   | 1 | 2 | 3 | 4 | 5 | 6 | 7 | 8 | 9 | 10 |
|---|---|---|---|---|---|---|---|---|---|---|
| 1 mij.ast.TreeVisitor | (1) | | | | | | | | | |
| 2 mij.ast.Node | | (2) | | | | | | | | |
| 3 mij.ast.Number | dp | in | (3) | | | | | | | |
| 4 mij.ast.OperExpr | dp | in | | (4) | | | | | | |
| 5 mij.ast.FuncExpr | dp | in | | | (5) | | | | | |
| 6 mij.ast.Variable | dp | in | | | | (6) | | | | |
| 7 mij.ast.UnaryOperExpr | dp | in | | | | | (7) | | | |
| 8 mij.Interpreter | | dp | | | | | | (8) | | |
| 9 mij.Interpreter$Calculator | m | dp | dp | dp | dp | dp | dp | | (9) | |
| 10 mij.parse.Convert | | dp | dp | dp | dp | dp | dp | | | (10) |

Visitor DR Space

DR Space with History

FIG. 7 The Graphical User Interface of Titan

| | 1 | 2 | 3 | 4 | 5 | 6 | 7 | 8 |
|---|---|---|---|---|---|---|---|---|
| | | | | | | | dp,26 | |
| 1 org.apache.hadoop.fs.FileSystem | (1) | | | | | | | |
| 2 org.apache.hadoop.fs.FilterFileSystem | ih,5 | (2) | | | | | | |
| 3 org.apache.hadoop.fs.RawLocalFileSystem | ih,5 | 5 | (3) | | | | | |
| 4 org.apache.hadoop.fs.s3.S3FileSystem | ih,8 | 4 | 8,(4) | (4) | | | | |
| 5 org.apache.hadoop.fs.kfs.KosmosFileSystem | ih, | | | (5) | (5) | | | |
| 6 org.apache.hadoop.dfs.DistributedFileSystem | ih,26 | 6 | 7,9 | | | (6) | | |
| 7 org.apache.hadoop.dfs.HftpFileSystem | ih, | | | | | | (7) | |
| 8 org.apache.hadoop.fs.InMemoryFileSystem$RawInMemoryFileSystem | ih,7 | 5 | 8,7 | | | 9 | | (8) |

Hadoop FileSystem Inherit DRSpace

FIG. 9

Table 1: Subject System Information

| Subject | History | #Files | #Rel. | #Trans. | #MR |
|---|---|---|---|---|---|
| JBoss 3.2.4 | 04.2000-06.2004 | 762 | 11 | 6458 | 550 |
| Hadoop 0.15 | 02.2006-10.2007 | 692 | 15 | 3001 | 490 |
| Eclipse 3.0.2 | 05.2001-03.2005 | 3704 | 10 | 27806 | 3458 |

FIG. 10

Table 2: Top DRSpaces

| #TopDRS | Avg. in Bug2 | | Avg. in Bug5 | | Avg. in Bug10 | |
|---|---|---|---|---|---|---|
| | dsb | bsc(#) | dsb | bsc(#) | dsb | bsc(#) |
| JBoss(9) | 62% | 10%(206) | 50% | 13%(129) | 18% | 30%(23) |
| Hadoop(11) | 67% | 11%(187) | 53% | 14%(106) | 47% | 18%(68) |
| Eclipse(11) | 31% | 7%(291) | 15% | 9%(98) | 9% | 13%(36) |

FIG. 11

Table 3: JBoss's Top DRSpaces

| #DRS | #Bug | #Bug2 206 #(dsb) | bsc | #Bug5 129 #(dsb) | bsc | #Bug10 23 #(dsb) | bsc |
|---|---|---|---|---|---|---|---|
| dr1:18 | 27(2nd) | 10(56%) | 5% | 7(39%) | 5% | 4(22%) | 17% |
| dr2:56 | 27(4th) | 32(57%) | 16% | 26(46%) | 20% | 10(18%) | 43% |
| dr3:28 | 18(7th) | 22(79%) | 11% | 18(64%) | 14% | 5(18%) | 22% |
| dr4:43 | 14(12th) | 27(63%) | 13% | 20(47%) | 16% | 5(12%) | 22% |
| dr5:76 | 11(21st) | 43(57%) | 21% | 35(46%) | 27% | 12(16%) | 52% |

FIG. 12

Table 4: Minimal Error Space Coverage

| Proj | Bug2 | | Bug5 | | Bug10 | |
|---|---|---|---|---|---|---|
| | #drs | bs%(#) | #drs | bs%(#) | # | bs%(#) |
| JBoss | 15 | 66%(206) | 9 | 57%(129) | 3 | 78%(23) |
| Hadoop | 23 | 77%(187) | 18 | 82%(106) | 12 | 88%(68) |
| Eclipse | 38 | 90%(291) | 13 | 92%(98) | 6 | 92%(36) |

FIG. 13

Table 5: Top Space Bug Coverage

| Proj | Bug2 | | Bug5 | | Bug10 | |
|---|---|---|---|---|---|---|
| | Top 5 | Top 10 | Top 5 | Top 10 | Top 5 | Top 10 |
| JBoss | 57% | 64% | 52% | 57% | 78% | 78% |
| Hadoop | 59% | 67% | 68% | 75% | 76% | 85% |
| Eclipse | 71% | 78% | 83% | 89% | 89% | 92% |

FIG. 14

RULE SPACES AND ARCHITECTURE ROOT DETECTION

CROSS REFERENCE TO RELATED APPLICATIONS

The instant application is a National Stage Application filed under 35 U.S.C. 371 of International Application No. PCT/U2014/056486, filed Sep. 19, 2014, which claims priority to U.S. provisional patent application No. 61/880,289, filed on Sep. 20, 2014, the contents of which are incorporated by reference herein in their entirety.

STATEMENT REGARDING FEDERALLY-SPONSORED RESEARCH AND DEVELOPMENT

The invention was made with United States Government support under award/grant no. 1065189 awarded by the National Science Foundation (NSF). The United States Government has certain rights in the invention.

TECHNICAL FIELD

The technical field generally relates to detecting errors in code and more specifically relates to the use of design rule spaces to detect architecture roots that propagate errors in code.

BACKGROUND

In the field of reverse engineering, numerous techniques have been proposed to recover the software architecture from source code. These approaches aim to improve the accuracy and comprehensibility of the recovered architecture. However, a means of leveraging the recovered architectural structure to inform software quality issues, such as the location of defects, has not been explored. In the field of data mining, numerous approaches have been proposed to leverage co-change information in revision history to locate error-prone files, and construct defect predictors. There is no known methodology for directly and effectively linking software architecture with quality issues such as error-proneness.

SUMMARY

Errors in software may be detected via the use of design rule spaces and root detection as described herein. A design rule space is a new form of architecture representation that may uniformly capture both architecture and evolution structures to bridge the gap between architecture and defect predictions. Software architecture may be seen as a set of overlapping design rule spaces, formed by one or more selected types of relationships, including both structure and evolutionary relationships, and clustered using a design rule hierarchy process. Considering evolution coupling as a special type of relationship, design rule spaces may reveal structural relations among error-prone files and design rule spaces may reveal structural problems contributing to error-proneness. Error-prone files may be captured by a few design rule sub-spaces. Design rule spaces formed by different types of relationships, including evolutionary dependencies, may be visualized, thus enabling one to visualize which error-prone files belong to which design rule spaces, and to visualize the structural problems. Visualization may provide insight into why files may be error prone. Design rule spaces may provide insight into which parts of an architecture are problematic, and on why, when, and how to refactor.

Also described herein is the process of root detection Root detection may comprise an architectural representation of software systems. This architectural representation may comprise a group of architecturally connected files that influence system error-proneness, generated through the interaction of design rule spaces and the set of error-prone files. The root detector may locate the core architecturally connected file groups that contribute the most to the error-proneness of a system. There groups are referred to herein as root spaces. The root detection process may, beginning with a set of error-prone files, search and link other files that are architecturally related. The output of the root detection process may be a set of design rule spaces, referred to herein as DRSpaces, ordered by the number of error-prone files they contain.

BRIEF DESCRIPTION OF THE DRAWINGS

Aspects of design rule spaces and root detection are described more fully herein with reference to the accompanying drawings, in which example embodiments are shown. In the following description, for purposes of explanation, numerous specific details are set forth in order to provide an understanding of the various embodiments. However, the instant disclosure may be embodied in many different forms and should not be construed as limited to the example embodiments set forth herein. Like numbers refer to like elements throughout.

FIG. 1 is an illustration of an example depiction of package clustering.

FIG. 3 is an illustration of an example depiction of an aggregate DR Space.

FIG. 5 is an illustration of an example depiction of a visitor DR Space.

FIG. 6 is an illustration of an example depiction of a DR Space with history.

FIG. 9 is an illustration of an example depiction of an inheritance DR Space of a file system.

FIG. 10 shows Table 1 depicting subject system information.

FIG. 11 shows Table 2 depicting top DR Spaces.

FIG. 12 shows Table 3 depicting DR Spaces.

FIG. 13 shows Table 4 depicting minimal error space coverage.

FIG. 14 shows Table 5 depicting top space bug coverage.

DETAILED DESCRIPTION OF ILLUSTRATIVE EMBODIMENTS

Figure 2:
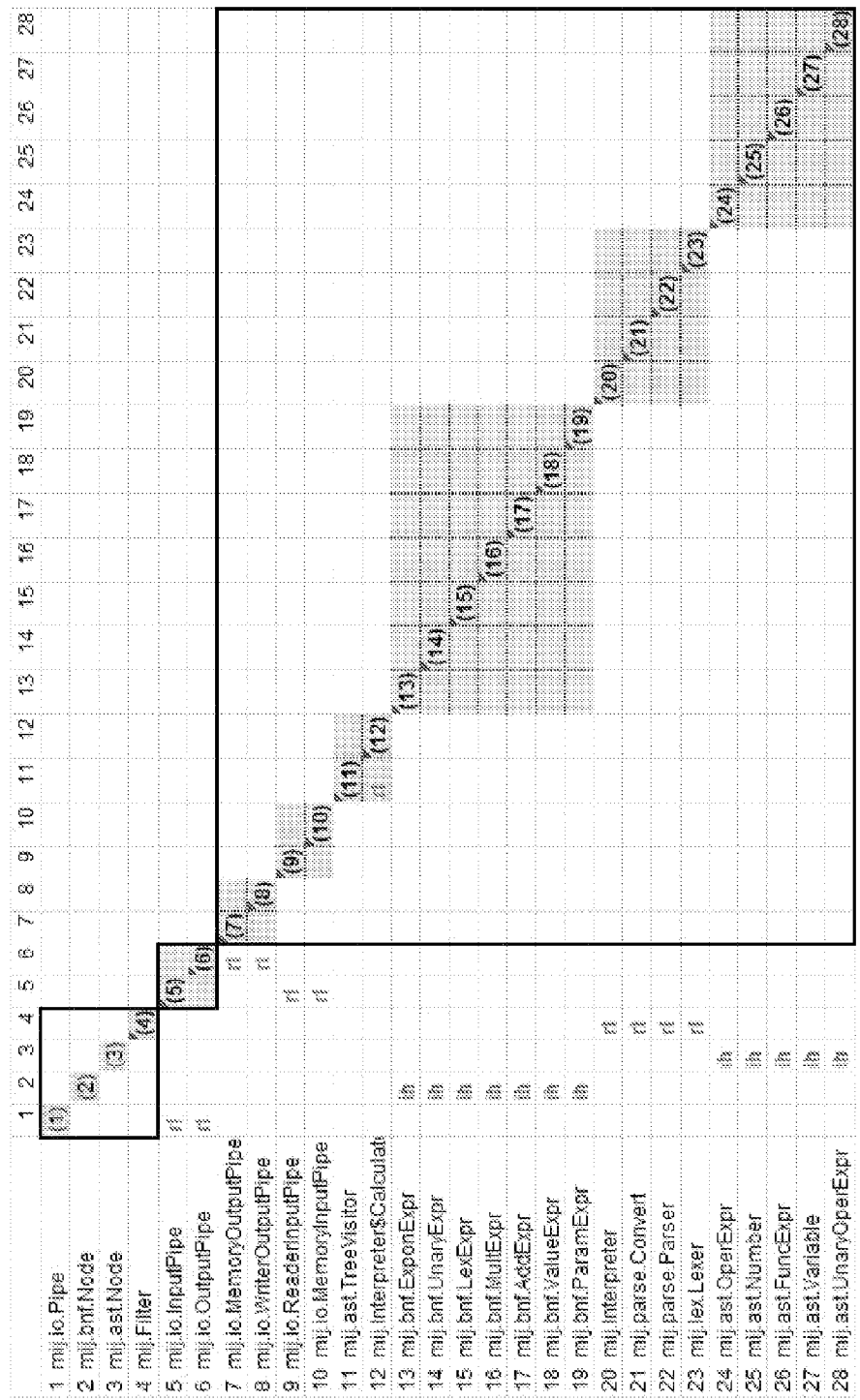
FIG. 2 is an illustration of an example depiction of an inheritance DR Space.

Design rule (DR) architectural interfaces may decouple portions of a system into independent modules. In an example embodiment, design rules, and modules framed by the design rules, may be basic elements of software architecture. And, as described herein, a Design Rule Hierarchy (DRH) may capture their relationships.

In an example application, a revision history was examined to determine how files were changed. It was determined that when a group of files frequently change together, but they do not have syntactical or architectural relationships, it tends to imply unencapsulated assumptions, implementation errors, or architectural problems. This history-belies-architecture phenomenon may be referred to as modularity violations. A problem with determining if modularity violations indicate an issue is that not all error-prone files have modularity violations, and vice versa. As described herein, a design rule space (DRSpace) may be utilized to bridge the gap between architecture and quality concerns. A DRSpace may be a special dependency graph whose vertices are a set of sources files, with the following features.

Its edges can be one or more selected types of relationships between sources files, including evolutionary coupling derived from revision history. Some of these relationship types can be designated as primary relations, and the other types are secondary relations.

It has one or more leading classes, wherein the design rules of the space preferably are be one of the leading classes, if the system is implemented correctly.

It is clustered into the form of a design rule hierarchy based on its primary relation.

As described herein, a single relationship may not be sufficient to capture the complexity of non-trivial software systems. Instead, software architecture may be viewed as multiple overlapping DRSpaces.

An example described herein shows that each type of dependency relation, such as aggregation and inheritance, may form its own meaningful DRSpace. By choosing evolutionary coupling as a secondary relation within a DRSpace, the modularity violations within the space may be visualized. Moreover, design patterns used in the system also may form unique DRSpaces that overlap with other DRSpaces formed by other patterns or relations.

In an example evaluation of the potential of DRSpaces, especially in terms of informing quality issues, investigated were the relation between DRSpaces and bug spaces—the spaces formed by error-prone files—in three large-scale open source projects, JBOSS, HADOOP, and ECLIPSE JDT. Supported by a tool referred to herein as Titan, three major results were obtained: First, if the design rule file leading a DRSpace is error-prone, then a significant portion of the files within the DRSpace are also error-prone. A DRSpace led by an error-prone file is referred to herein as an error-prone DRSpace.

Second, although a project may have hundreds of error-prone files, they are usually captured in a few error-prone DRSpaces. In all three projects, more than 50% of the error-prone files were captured by 5 error-prone DRSpaces.

Third, all error-prone DRSpaces exhibit multiple structural and evolution issues, either violating commonly accepted design principles, or revealing exceptionally unstable architectural interfaces. The result also shows that not all structural problems, such as cyclic dependencies, cause quality or maintainability issues. By choosing evolution coupling as the secondary relation within a DRSpace, one can visualize which structural problems are actually incurring high maintenance costs.

These results imply that, when investing the root cause of bugs, one should consider the DRSpace that these error-prone files belong to, because their structural issues may contribute to their bugginess. It is shown that error-prone files influence the error-proneness of other files within the same DRSpace. Furthermore, the DRSpace may help to identify the root cause of the bugginess (for example, cyclic dependencies), and thus indicate how such problems may be resolved.

Much of the analysis described herein is based on the concept of a design rule (DR). DRSpaces, based on design rules, are presented herein in the form of a design structure matrix (DSM), organized as a design rule hierarchy (DRH). A DRSpace may visualize modularity violations.

Design Rule (DR). A modular structure may be framed by design rules, the architectural decisions that decouple the rest of system into modules, so that each module can evolve independently from each other. Object-oriented software systems design rules may be in the form of interfaces or abstract classes. For example, if a software system employs an observer pattern, the pattern may be led by an observer interface, which decouples subjects from concrete observers. If the interface is stable, changes to concrete observers and subjects may not influence each other. In this case, the observer interface is considered as a design rule, and the subjects and concrete observers form two independent modules.

Figure 1:
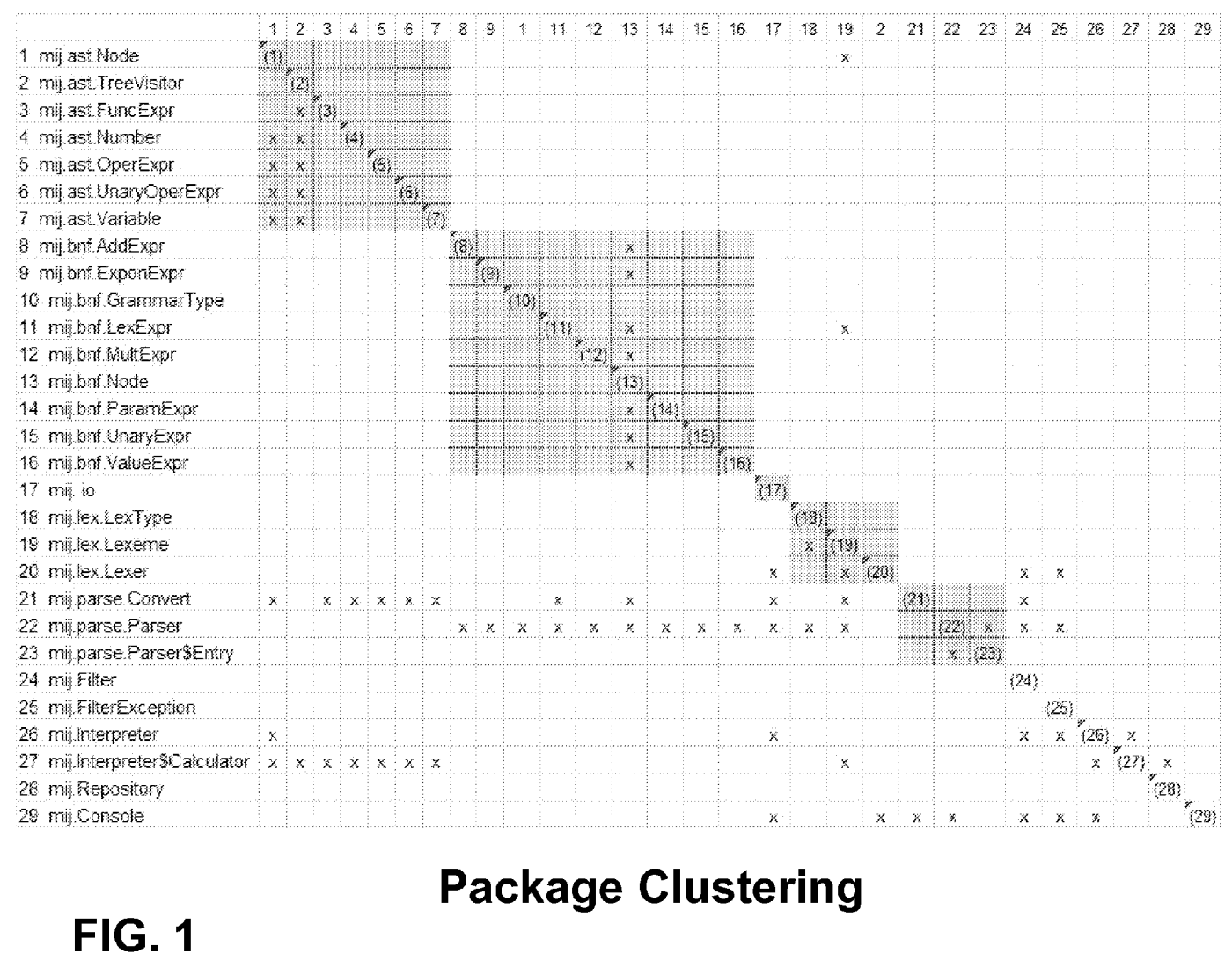

Design Structure Matrix (DSM). These concepts can be visualized as a design structure matrix (DSM). A DSM is a square matrix with its rows and columns labeled by the same set of element names and/or numbers, in the same order. A cell along the diagonal represents self-dependency, and an non-empty off-diagonal cell captures some relation between the element on the row to the element on the column. For example, in FIG. 1, the mark in cell, c:(r4,c1), indicates that mij.ast.Number (row 4) depends on mij.ast.Node (column 1 ). The shaded squares along the diagonal model a set of elements that are grouped together.

Design Rule Hierarchy (DRH). To manifest the special position of design rules and their effects on decoupling the rest of the system into modules, a concept called design rule hierarchy (DRH) is introduced. A DRH is a structure that can be calculated from a dependency graph. Shown in a DSM, a DRH structure has the following characteristics: 1) the elements in the lower layer of the hierarchy only depend on the elements of higher layers; 2) within the same layer, each group of elements are independent from each other. In other words, the elements at the top of the DRH are design rules of the following lower layers, and the groups within a layer form independent modules of that layer.

FIG. 3 depicts such a DRH structure. This DSM has two layers with dark borders: l1 :(rc1-5) and l2 :(rc6-13). Within l2, there are 3 modules: m1:(rc6-7), m2:(rc8-9), and m3: (rc10-13). These modules are mutually independent from each other because, within this layer, there are no relations outside these shaded groups. In this case, the 5 elements (grouped in 4 modules) in the first layer are the design rules of the second layer because they influence the second layer elements, but are not influenced by them.

The original DRH algorithm was extended to better support architecture recovery from source code, which is referred to herein as the architectural design rule hierarchy (ArchDRH) algorithm. ArchDRH recognizes the existence of another special type of element commonly found in a software architecture: control programs. A control program, such as a class with a main function, usually depends on many other classes, but is not depended on by them. ArchDRH additionally separates these control elements into the bottom of a module, and supports recursively clustering the rest of the module into a DRH structure.

Figure 4:
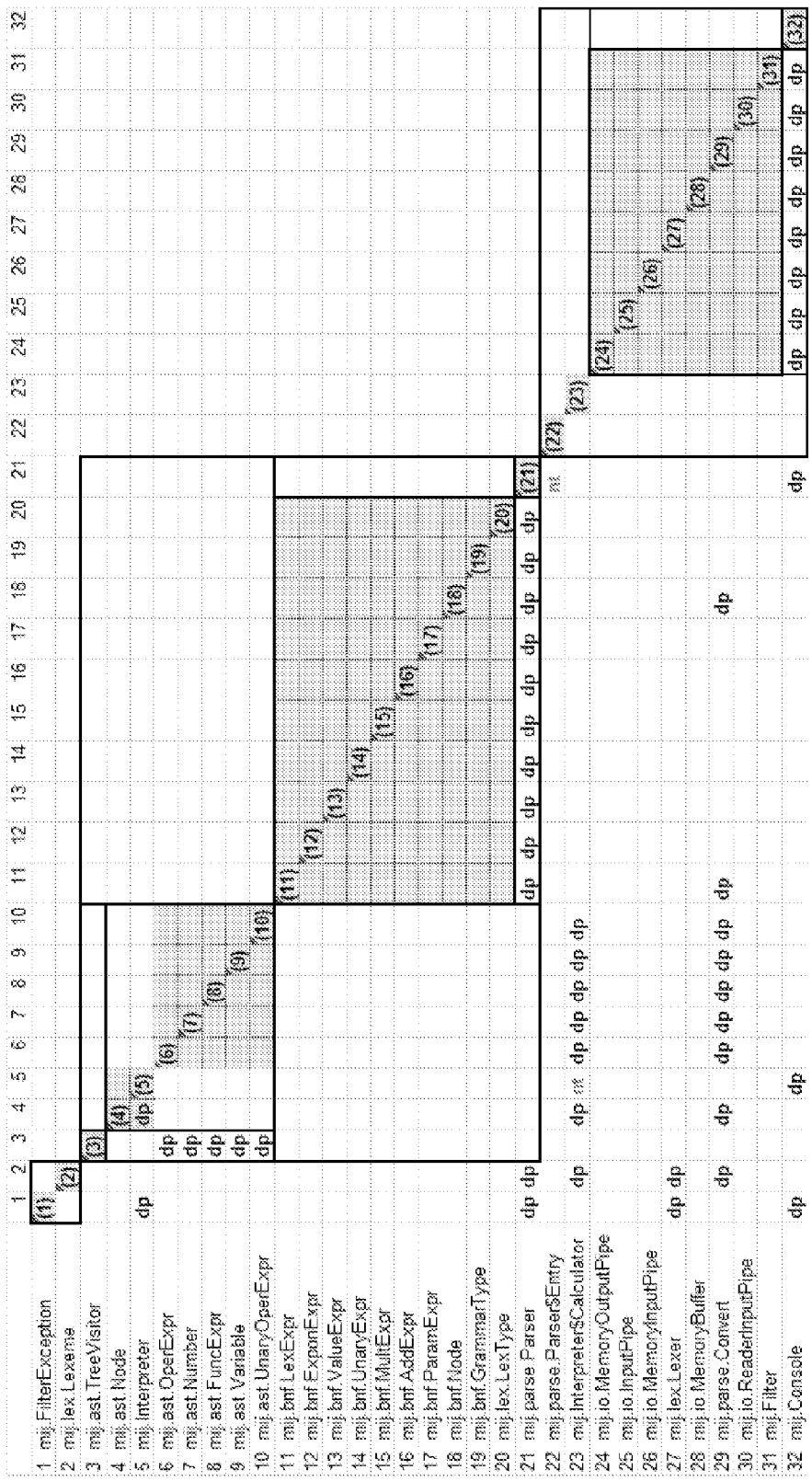
FIG. 4 is an illustration of an example depiction of a depend DR Space.

FIG. 4 depicts an output of ArchDRH. The algorithm first identifies three layers: l1:(rc1-2), l2:(rc3-21), and l3:(rc22-

32). Within l2, it first calculates two modules, m1:(3-10) and m2:(11-21), and then recursively calculates the DRH structure within each module. For example, m2 is further calculated into a two-layer hierarchy: l4:(rc10-20) and l5:(rc21-21). It first separates mij.parse.Parser, the control class of the module, into l5, and then aggregates the rest into one module m:(rc10-20) within l4. Most of the DSMs described herein are calculated using this ArchDRH algorithm.

For simplification, the structure processed and output by the recursive ArchDRH algorithm is referred to as a design rule hierarchy (DRH).

Modularity Violation. A tool, referred to herein as Clio, was utilized to compute the discrepancies between how files should change together based on their modular structure, and how they actually changed together as revealed by version history, a concept called modularity violation. Experiments with open source projects showed that Clio not only revealed many known structure problems, such as code clones or poor inheritance structure, it also detected a large number of undefined couplings that were verified to be harmful.

A project's architectural problems were identified by analyzing and investigating the structural significance of the most complicated and error prone files. It was also investigated how files evolved together without being structurally related. In this way, a large number of "shared secrets" (undocumented assumptions), implementation errors, and architecture violations were identified. Many of these problems were recognized to be the direct cause of defects.

An example is described below to illustrate the concept of a design rule space (DRSpace). As mentioned, a DRSpace may be defined as a graph with the following characteristics:

(1) A DRSpace is composed of a set of source files, and one or more selected types of relations between them. The major types of relations explored herein include three major structural relations in object-oriented design: inheritance/realization, aggregation, and dependency, as well as one evolution relation: evolutionary coupling derived from revision histories. For example, in a specified time period of the evolution history, if two files are committed together 10 times as recorded in the version control system, it is determined that they are evolutionarily coupled with a weight of 10, during this period. Theoretically, a DRSpace can accommodate additional types of relations, such as run-time or data-flow relations.

(2) The vertices (sources files) of a DRSpace are clustered into the form of design rule hierarchy (DRH) based on one or more selected types of relations. These selected relations that form a DRH structure are referred to as the primary relations of the DRSpace. Using the tool, Titan, a user can choose to include other types of relations in a DRSpace for analysis purposes, which are called the secondary relations of the DRSpace. For example, to visualize modularity violations, one first creates a DRSpace with one or more of the three structural relations to show the designed modular structure, and then chooses evolutionary coupling as the secondary relation to visualize where violations occur.

(3) A DRSpace has one or more leading classes, that is, the de facto design rules of the space. If the DRSpace's DRH has more than one layer, the classes within the first layer are the leading classes of the DRSpace. If a DRSpace only has one layer, all the classes can be considered as leading classes. If a DRSpace, ds, has a leading class c, this is referred to as the ds is led by c.

They are called leading classes to distinguish them from the original concept of design rules. The latter usually refers to architecture decisions of the overall system. A leading class of a DRSpace, by contrast, is only leading relative to a specific DRSpace, and may or may not be an architecturally important design rule. At one extreme, if a DRSpace only has one class, this class is still called the leading class of the space, but it cannot be a design rule because there are no other classes in its space and it does not decouple and frame modules.

Illustration. Described below is an example to demonstrate that each type of relation, or group of types, can form a meaningful DRSpace. Using Titan, DRSpaces can be automatically calculated. All the DSMs shown below were exported from Titan. For the sake of space, in these DSMs, inheritance/realization, aggregation, and dependency relations are marked in the cells using ih, ag, and dp respectively.

FIG. 1, FIG. 2, FIG. 3, FIG. 4, and FIG. 5 depict the different modular views of the same calculator program, recovered from its Java source code. This program supports simple math calculations, such as addition, subtraction, and multiplication. The system is designed using an interpreter pattern with a parser and lexer. It also employs a visitor pattern so that different operations can be done in the same abstract syntax tree (AST). Different components of the system, such as lexer and parser, communicate with each other using a pipe and filter pattern. As a reference, FIG. 1 shows its package structure, similar to the DSM created by most reverse engineering tools, such as Lattix, for example.

FIG. 1 shows that this system has five packages, depicted as shaded groups along the diagonal. This program has 36 classes. The DSM shows 29 elements because the io folder is collapsed. The cells of the DSM are marked with "x" because it uniformly models all types of relations as dependency.

Now it is shown that the architecture of this system comprises multi-layer DRSpaces.

1. Inheritance DRSpace. FIG. 2 depicts the DRSpace that uses inheritance/realization relation as the primary relation. There are three layers in this DRSpace. The first layer l1:(rc1-4) contains four leading classes: mij.io.Pipe, mij.Filter, mij.bnf.Node, and mij.ast.Node. The second layer contains mij.io.InputPipe and mij.io.OutputPipe. Because they both realize the same parent class, the ArchDRH algorithm considers them as belonging to the same module. The classes within these two layers decouple the rest of system into 6 independent modules as shown in the third layer of the DSM: m1:(rc7-8), m2:(rc9-10), m3:(rc11-12), m4:(rc13-19), m5:(rc20-23), m6:(rc24-28). It can be seen that each module has its own meaning. For example, m4 captures all the bnf classes in a module, m6 groups all the ast classes into a module, and m5 contains all the classes that are a type of Filter. This modular structure has not been observed in other clustering methods or using other types of relations.

2. Aggregation DRSpace. FIG. 3 depicts the DRSpace in which the primary relation is aggregation. There are two layers in this DRSpace. The first layer, l1:(rc1-5), contains four modules of leading classes, and the second layer contains three meaningful modules. For example, m1:(rc8-9) is a MemoryBuffer module that contains two classes using it; m2:(rc10-13) groups major components such as parser and lexer together because they all communicate through pipes, and thus aggregate, mij.io.InputPipe and mij.io.OutputPipe.

3. Dependency DRSpace. FIG. 4 depicts the DRSpace with dependency as the primary relation. Completely different from the other two DRSpaces, this DRSpace shows how classes work together to accomplish a function. For example, m:(rc11-20) shows which classes the parser needs in order to accomplish the parsing function.

4. Pattern DRSpace. FIG. 5 depicts a DRSpace led by mij.ast.TreeVisitor. As can be seen, this DRSpace captures the overall structure of the classes that participate in the visitor pattern. The key design rules of this pattern include mij.ast.TreeVisitor, acting as the role of visitor interface, and mij.ast.Node, acting as the element interface. The classes in the module m:(rc3-7) contain all the concrete elements of the pattern. These classes are all subclasses (the "ih" relation) of mij.ast.Node, which fills the element role in the visitor pattern. They all accept the visitor interface, and pass themselves to the visitor interface (the "dp" relation), as required by the pattern. The Calculator class takes the concrete visitor role through the realization ("rl") relation to mij.ast.Treevisitor.

Figure 6:
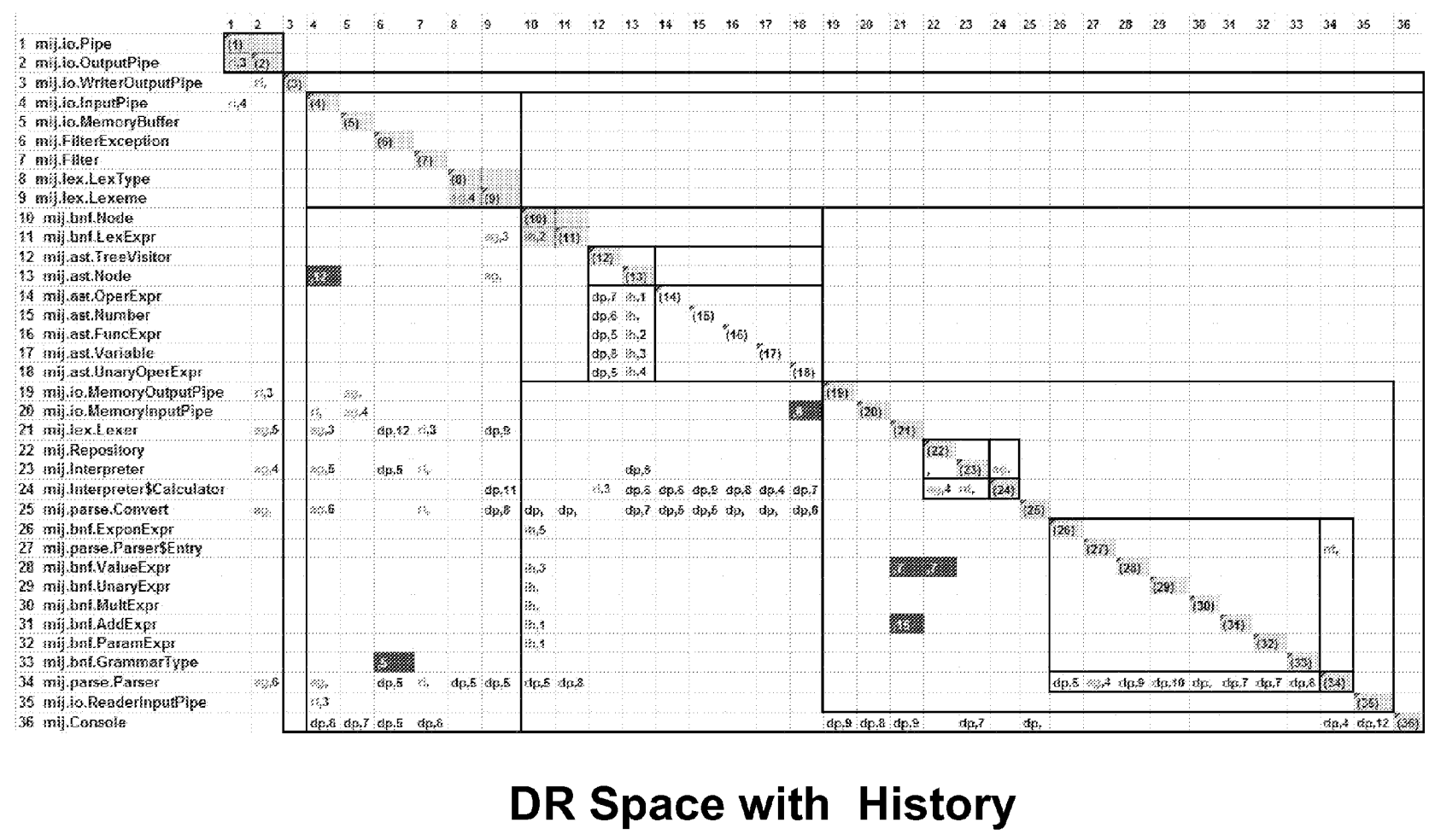

5. Hybrid DRSpace. FIG. 6 depicts a DRSpace in which the DRH is produced using all three types of structural relations as primary ones. As can be seen, all the interesting and meaningful modular structures that can be observed from previous DRSpaces are all mixed up, and become less obvious. The DRH now has many more nested layers.

In this DRSpace, evolutionary coupling is chosen as the secondary relation. For example, cell c:(r13, c4) has number 12, meaning that mij.ast.Node and mij.io.InputPipe changed together 12 times in the revision history. This cell has dark background and white font to indicate that there are no structural relations between these classes. The content in cell c:(r23, c2) is "ag,4", meaning that mij.Interpreter aggregates mij.io.OutputPipe, and they changed together 4 time in the revision history. As an illustrative example, the history of this system is faked. In real systems, as shown in Section 5, the dark cells indicate modularity violations.

As demonstrated above, the architecture of this small system may be viewed as a set of multi-layer DRSpaces. Each DRSpace presented above reflects a unique aspect of the architecture that cannot be captured using any other types of relations or clustering methods.

An architecture root detector is described below. The basic idea is to calculate the interaction between design space and bug space. Various terms and measures used in the root detector algorithm are defined below.

DRSpace of Leading Files: A Design Rule Space can be generated by splitting out a sub system from a project using one or several leading files. It requires 2 inputs to generate a DRSpace.

The structure DSM of a project D.

The set of leading files leadingFiles.

The process works as follows: first, the structure DSM of a project is clustered using the DRH process. Then all the modules that depend on the leading files are extracted to form a new sub DSM. This is called a new sub DSM a DRSpace led by the selected leading files.

A bug space may be defined as a set of error-prone files, and may be determined by the following parameters.

Timespan: The error-proneness of a file may change over time, so the timespan of the evolution history is a parameter that determines which files should be included in a bug space. One can measure the timespan of a bug space using either by the number of months or the number of snapshots. Take Camel for example: a Timespan of 53 months or 46 snapshots covers its entire evolution history.

Threshold: This parameter indicates how buggy the files are within a (portion of a) bug space. For each file, one may determine its \emph{bug frequency}—the number of times a file is changed to fix bugs in a given timespan —as a measure of file error-proneness. Since each project has different number of buggy files, all the files within a project snapshot are ranked based on their bug frequency, and then a percentile ranking is used to indicate the error-proneness threshold for a file to be included into a bug space.

For example, consider the revision history of Camel up to version 2.11.1. There were 1573 files that were changed at least once to fix bugs (that is, with bug frequency of 1 or more). If one considers a bug space with a timespan equal to the full length of Camel's evolution history, and a bug percentile of 100, then this bug space will contain all 1573 files.

Now the most error-prone file in Camel's full bug space was changed 98 times. To form Camel's 10 percentile bug space (the top 10 buggy core), first checked was the bug frequency of the file ranked 157th in terms of bugginess (since 157 is 1/10th of 1573, when rounded). In this case, the 157th most error-prone file is SmppSubmitMultiCommand, and it was changed nine times in the timespan. Then all the files with bug frequency of nine or higher are included in this bug space; this is its bug threshold.

---

Algorithm 2 Root Space Detection (D, BugD)

```
RootSpaces ← ∅
leadingFiles ← ∅
leadingModules ← ∅
BD←BugD.clone( )
while BD.edges( ).size( ) > 0 do
    maxImpactFile←BD.maxFanoutFile( );
    leadingFiles.add(maxImapctFile);
    oNbs←BD.outNeighbours(maxImapctFile);
    BD.remove(maxImapctFile);
    BD.removeAll(oNbs);
end while
leadingModules ← aggregate(BugD,leadingFiles)
BD←BugD.clone( )
while leadingModules! = null do
    maxLM←maxCover(leadingModules,D,BD);
    leadingModules.remove(maxLM);
    maxDRSpace←split(D,maxLM);
    BD.removeAll(maxDRSpace.vertices( ));
    RootSpaces.addToTail(maxDRSpace);
end while
return RootSpaces
```

---

Algorithm 1 split (D, leadingFiles)

```
DRSpace ← ∅
drhCluster ← DRH(D)
for each Module in drhCluster do
    for each LDFile in LeadingFiles do
        if Module depend on LDFile in D then
            DRSpace.addVertices(Module.vertices( ));
            DRSpace.addEdges(Module.edges( ));
        end if
    end for
end for
return DRSpace
```

```
Algorithm 3 maxCover (leadingModules, D), BD)

max ← 0
    maxLM ← null
    for each LM in leadingModules do
        DRSpace ← split(D, LM);
        DRSpace.retainAll(BD.vertices( ));
        if DRSpace.vertices( ).size( ) > max then
            max ← DRSpace.vertices( ).size( );
            maxLM ← LM;
        end if
    end for
    return   maxLM
```

If percentile of a bug space is chosen, then its bug threshold is also determined. For the Camel example, its top 10 buggy core has a bug threshold of 9. One can also call this bug space a Bug9 space. Note that a Bug9 space in any project will contain files with bug frequency of 9 or higher, but these Bug9 spaces will be formed by different percentiles of different projects' files.

In a DRSpace led by one or more buggy files, if any files within the DRSpace are also within a given bug space, it means that the DRSpace covers a percentage of the bug space. For each DRSpace, two parameters are defined to describe its relation with a Bug Space.

Design Space Bugginess (dsb). It is the percentage of files in a DRSpace that is also in a Bug Space.

$$dsb = \frac{DRSpace \cap BugSpace}{DRSpace}$$

Bug Space Coverage (bsc). It is the percentage of files in a Bug Space that is also in a Design Space.

$$bsc = \frac{BugSpace \cap DRSpace}{BugSpace}$$

Given a bug space, one can calculate a minimal number of DRSpaces to cover a certain portion of the files within it. The minimal set of such DRSpaces was considered as the Roots of the bug space, and were called Root Spaces for short. For the Root Spaces: RS={$S_1$, $S_2$, . . . , $S_n$}, defined as:

Bug Space Coverage by Root ($bsc_{root}$). It is the bsc of the union of all the DRSpaces in the Root Spaces set.

$$bsc_{root} = \frac{(S_1 \cup S_2 \ldots \cup S_n) \cap BugSpace}{BugSpace}$$

The number of Roots of a bug space, #Roots, may be used to indicate how closely these buggy files are architecturally connected. If #Roots is large, it means that buggy files are dispersed into multiple DRSpaces and are not closely related. To one extreme, if the minimal number of DRSpaces, #Roots, needed to cover a bug space with n files is n, it means that no DRSpace could be found that simultaneously contains any two files in the bug space, indicating that they are not architecturally related at all. To the other extreme, if there is a single DRSpace that contains all n files within the bug space, it means that all buggy files are architecturally connected, directly or indirectly. A process, described below, detect the Root Spaces of a project for a given Bug Space.

The architecture root detection process may accept the following two inputs.

The structure DSM (D) of a project.
The structure DSM (BugD) of a Bug space with a given timespan and percentile in a project.

The architecture root detection process returns a minimal set of DRspaces, each led by one or several buggy files, that covers the given bug space (BugD). The first while loop in Algorithm 2 finds a minimal set of files: leadingFiles from BugD. All other files in BugD, except the isolated ones, directly depend on at least one file in LeadingFiles. Then the structurally connected files in set leadingFiles are aggregated into groups and those groups form a set leadingModules. The second while loop finds one element from leadingModules: maxLM, using the method maxCover defined in Algorithm 3. The maxCover finds maxLM which lead a DRSpace, maxDRSpace, that has the biggest intersection with BugD compared to spaces led by other items in leadingModules. The maxLM is removed from leadingModules. All the files in maxDRSpace are removed from BugD and maxDRSpace is added to the end of RootSpaces. The above steps are repeated until leadingModules become empty.

The first DRSpace returned by the process always covers the largest portion of error-prone files. By feeding the process with different input bug spaces one can generate RootSpaces of a project for different purposes. For example, one can increase the threshold of a bug space to investigate the number of DRSpaces it takes to cover more buggy files. One also can limit the timespan of bug spaces to the most recent releases to see if recent buggy files are architecturally connected. In most cases, as show below, the majority of files in a bug space are covered by a few root spaces.

In this section, the tool, Titan, is described. Titan was used to support the creation and visualization of DRSpaces. Titan accepts DSM files, with extension.dsm, and clustering files, with extension.clsx, as input. A.dsm file captures pair-wise relations among classes. For a "structure DSM", the number in a cell is used to represent different types of relations. So far our tool processes inheritance, realization, dependency, nested, and evolutionary coupling relations. For a "history DSM", the number in a cell represents the number of time the two classes changed together (where "changed together" means that both classes were involved in the same commit), which is called co-change frequency. One.dsm file can be associated with multiple clustering files, each representing a different way the DSM can be clustered.

Figure 7:
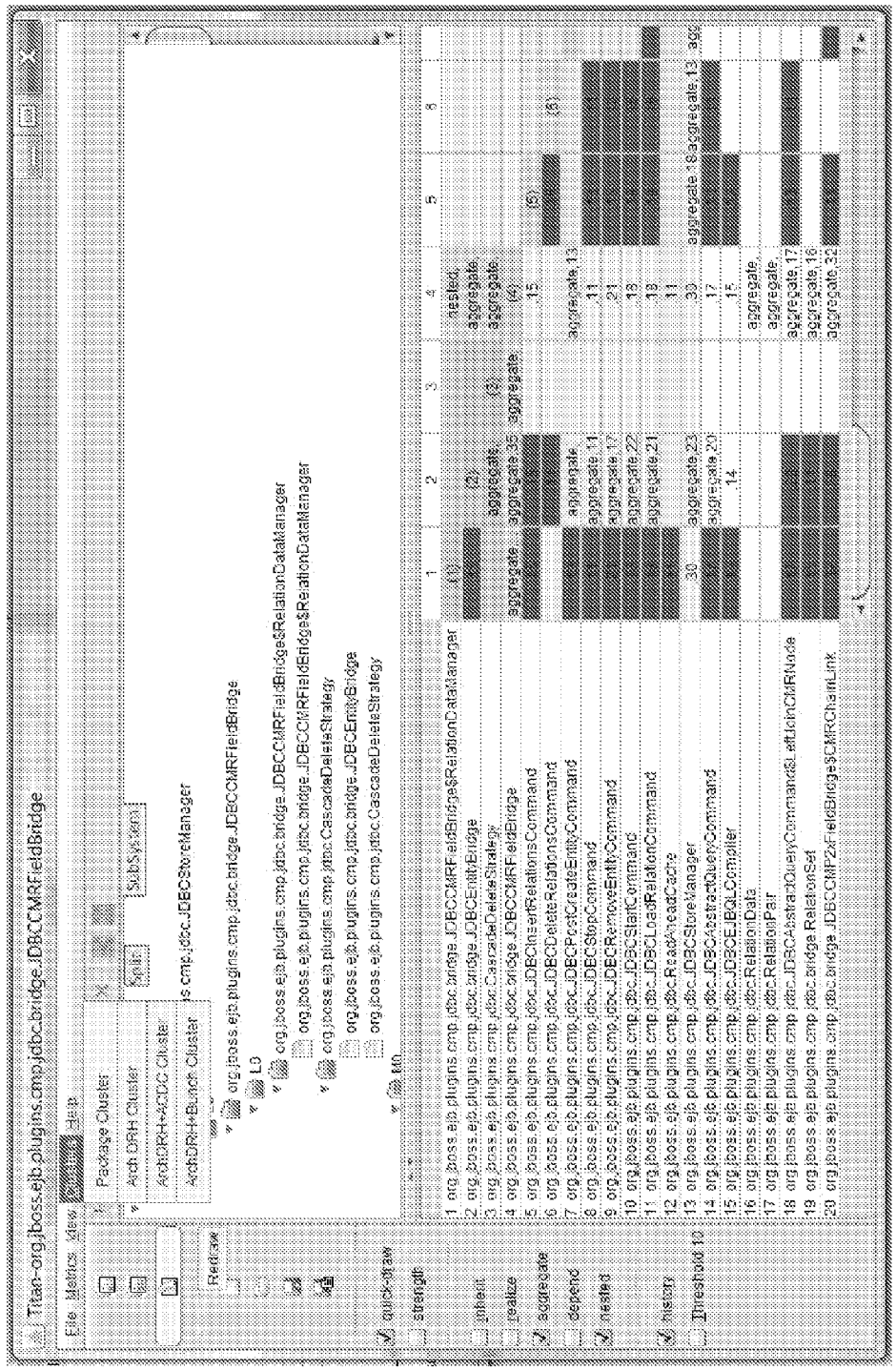
FIG. 7 is an illustration of an example depiction of a graphical user interface for Titan.

FIG. 7 shows a snapshot of Titan's GUI. Similar to DSM-based user interfaces, Titan has a tree structure view (the top right part) and a DSM view (the lower right part).

The Tree View. When a structure DSM file is first opened, the tree view renders classes randomly. After the user loads a clustering file, the tree view is redrawn to reflect the given structure. Using the tree view, the user can expand, collapse, group, and ungroup classes, and the DSM view will be updated when the user clicks the redraw button. The user can also cluster the DSM using an algorithm by choosing the Clusters menu item. As shown in the figure, currently Titan supports the following clustering methods.

Package Cluster. The DSM will be clustered based on the project's package and namespace structure.

ArchDRH Cluster. This is the clustering method employed to generate DRSpaces in this paper.

ArchDRH+ACDC Cluster and ArchDRH+Bunch Cluster. Each inner module of a DSM first framed using ArchDRH can be further clustered using other algorithms.

The user can also view partial DSMs in two ways. If a tree node (folder) is selected, the SubSystem button will be activated. Clicking it creates a new GUI representing only the subspace within the chosen folder.

If a DSM is clustered using ArchDRH, and at least one tree leaf (class) is selected, the Split button will be activated. Clicking it creates a new window that contains only the classes in the DRSpace led by the selected class(es). All the DRSpaces described herein are generated this way.

The window created by clicking the Split or SubSystem button is the same as the original GUI so that the user can treat the subspace as an entirely independent design space, which can be further manipulated or splitted.

The DSM View. In the DSM view, each group of classes is colored using a dark background. A nested group has a darker background than the outside group. The diagonal line is labeled with the index of the class. The relation displayed in the cells can be controlled using the check-boxes located at the left lower corner of the GUI.

The user can check and uncheck any listed relation, or any combination of them, to control the display. Once the relation types are selected, clicking the clustering menu item will cluster the DSM using the selected relations as primary relations. That is how the aggregation, inheritance, and dependency DRSpaces were generated. To show the evolution coupling together with structure relations, the user first loads a history DSM, and then checks the history checkbox. The cells of the DSM will then display how many times each pair of classes have changed together in the history. For example, the DSM in FIG. 7 displays aggregation, nesting, and history relations. The cell c:(r8,c2) has: "aggregate,11", meaning that JDBCStopCommand aggregates JDBCEntity-Bridge, and they changed together 11 times.

If two classes do not have any structural relation but still changed together, the cell will have a red background. For example, cell c:(r2,c1) shows that although JDBCEntity-Bridge and RelationDataManager have no structural relation, they changed together 35 times.

The user can control the co-change frequency to be displayed by checking the Threshold box and filling a number in a pop-up window. In the DSM of FIG. 7, the threshold is set to 10, so that only cells with co-change frequency of 11 or more are displayed.

To summarize, Titan allows the user to choose any combination of relation types, and to cluster the DSM based on the selected primary relation(s) only. Moreover, it supports the display of evolution coupling together with structure relations so that the discrepancies can be visualized immediately.

As an evaluation of the usefulness of DRSpaces, it was determined whether DRSpaces can provide insights on bug location. The following research questions (RQs) were.

RQ1: Is it true that if a design rule is error-prone, then the files contained in its DRSpace are also error-prone? If the answer is yes, it means that (1) these error-prone files within the same DRSpace should be considered together because they are structurally related, even though these files may not depend on each other directly; (2) these design rules should be given higher priority in terms of bug fixing (and, potentially, refactoring) given their significant impact.

RQ2: Are most error-prone files concentrate in a few DR spaces? If the answer is yes, this implies that even if a system has hundreds of error-prone files, one should be able to understand their relationships by just looking into a few DRSpaces. Furthermore, this implies that these error-prone files, or error-prone file groups, are not isolated, but rather they are structurally related, and thus should be treated together.

RQ3: By combining information about evolution and structure, can one get more insight into architectural problems? Can this help find not just the locations of errors, but also the reasons for them? So far, the prevailing bug-location research focuses on where the bugs are, rather than why these locations are error-prone. Although error-proneness can be caused by many reasons, it has been shown herein that structural errors can be an important source of bugginess. Explored herein is whether the combination of different types of DRSpaces can shed light on the structural problems among these error-prone files.

Three large-scale open source projects were chosen as evaluation subjects: JBOSS2—a Java application server, HADOOP Common3—the common utilities supporting a suite of distributed computation tools, and ECLIPSE Java Development Tools (JDT)4—a core AST analysis toolkit in the ECLIPSE IDE. For each project, one target release was chosen to analyze its DRSpaces. It was ensured, however, that there were at least 10 releases before the target release so that history DSMs and identify error-prone files could be produced. The target project releases, evolution history time span, and the number of releases before the target can be found in Table 1. History DSMs were generated using revision and issue tracking histories. Using HADOOP as an example, its SVN repository to extract transactions was investigated. Data is presented in Table 1 regarding the number of transactions and issues studied. Commits with only one file or more than 30 files were removed because they either do not contribute to evolution coupling or they introduce substantial noise in the data, such as bulk changes to files to update the license information.

Regarding DRSpace error proneness, to answer the first research question, for each target release, all the files were ranked by the number of times they were involved in bug fixes. As observed, the more often a file is involved in a bug fix, the more error-prone it is. For each of the 30 most error-prone files in each project, Titan was used to determine its DRSpace. If the size of a DRSpace is small, it means that this file is not a high-impact design rule. Next, the size of the DRSpaces of the 30 most error-prone files was ranked, and only DRSpaces with at least 10 files were considered. These were called Top DRSpaces.

Table 2 summarizes the status of Top DRSpaces for each project. For example, in JBOSS, 9 out of the 30 most error-prone files lead a DRSpace with at least 10 files. In both HADOOP and ECLIPSE, this number is 11. Because there is no obvious threshold on the number of bug fixes to determine if a file is error-prone, for each project the following conventions were used.

A bug space, BugN, is defined as the set of files with at least N bugs. In this research, values of 2, 5 and 10 for N were chosen, which resulted in three bug spaces: Bug2, Bug5, and Bug10.

Design space bugginess, dsb, is defined, such that, if a DRSpace has m files, and n of them are within a bug space of size x, n/m as the design space bugginess of the DRSpace, represented as dsb in the tables.

Bug space coverage, bsc, is defined, such that, if a DRSpace has n files in BugX, then the bug space coverage of the DRSpace with respect to BugN is n/size(BugN).

For example, in JBOSS (Table 3), there are a total of 206 files with 2 or more bug fixes (Bug2), 129 files with 5 or more bug fixes (Bug5), and 23 files with 10 or more bug fixes (Bug10).

Consider design rule dr2, org.jboss.ejb.Container, whose data is shown in the second row of Table 3. It is the 4th most error-prone file in JBOSS and leads a DRSpace with 56 files. Of these 56 files, 32 of them have more than 2 bug fixes. Thus the bsc of dr2 in JBOSS is 16% (32/206) with respect to Bug2. Similarly the bsc for Bug5 as 20% (26 out of 129), and for Bug10 as 43% (10 out of 23) was calculated. Furthermore, the dsb of dr2 is 57% with respect to Bug2 (32 out of the 56 files within dr2 are in Bug2), 46% with respect to Bug5 (26 of the 56 files are in Bug5) and 18% with respect to Bug10 (10 of the 56 files are in Bug10).

Table 3 lists the first 5 (out of 9) most error-prone DRSpaces in JBOSS. Consider dr5, BeanMetaData; it has the largest DRSpace with 76 files. Within these 76 files, 43 (57%) have more than 2 bug fixes, 35 (46%) have more than 5 bug fixes, and 12 (16%) have more than 10 bug fixes. These 12 files cover more than 50% of the all the files in Bug10. This result shows that not only is BeanMetaData itself bug-prone—it has 11 bug fixes, and is ranked the 21st overall in terms of error-proneness—but a substantial part of the DRSpace it is leading is also error-prone. The other 4 DRSpaces show similar results: their dsb values for Bug2, Bug5, and Bug10 range from 56%-79%, 39%-64%, and 12%-22% respectively.

Table 2 shows the average dsb and bsc values for each project. The first line of the table shows that in JBOSS, there are 9 DRSpaces led by the most error-prone files. On average, within each DRSpace, 62% of the files have more than 2 bug fixes, 50% of them have more than 5 bug fixes, and 18% have more than 10 bug fixes. Although the dsb decreases with the size of bug spaces, the bsc increases. For example, the average bug space coverage of a JBOSS DRSpace in Bug10 is 30%, meaning that on average, the top DRSpaces in JBOSS contain about one-third of the most error-prone files (with 10 or more bug fixes each).

Table 2 also shows that the bsc and dsb for ECLIPSE DRSpaces are much lower than the other two projects. For example, its design space bugginess for Bug5 (15%) is only about one-third of the other two projects (50% and 53%). To explore why ECLIPSE is special, the dependency density of each top DRSpace of each project was calculated. The dependency density is the number of dependencies within a DRSpace divided by the square of its size. The higher the density, the more tightly coupled the files within the DRSpace. The result shows that the average density for JBOSS and HADOOP DRSpaces are 12% and 15% respectively, while the density for ECLIPSE is 7%. Thus, the more highly coupled the files within a DRSpace, the more that the DRSpace can be influenced by error-prone design rules and neighbor files.

In summary, the aforementioned results show that if a file is error-prone and leading a highly coupled DRSpace, then a significant portion of the DRSpace is also error-prone. Thus a DRSpace led by an error-prone file is determined to be an error-prone DRSpace.

With respect to error-prone DRSpace coverage, the second research question is investigated below. A project may have hundreds of error-prone files. Can they be captured by a much smaller number of DRSpaces led by error-prone design rules? This problem was explored by answering two complementary questions: 1) How many DRSpaces are needed to maximally cover Bug2, Bug5, and Bug10; and 2) How large of a bug space can the top 10 largest DRSpaces cover? To answer these questions, all the DRSpaces with at least 10 files led by error-prone files were ranked based on their non-overlapping bug space coverages. The results, summarized in Table 4, answer the first question. Take JBOSS for example: the first 15 DRSpaces cover 66% of the Bug2 space; the first 9 DRSpaces cover 57% of the Bug5 space, and the first 3 DRSpaces cover 78% of Bug10 space. 100% coverage is not reached because only DRSpaces with at least 10 files were considered. The other error-prone files are distributed in smaller DRSpaces.

To answer the second question, the bsc of the first 5 and 10 DRSpaces is listed in Table 5. Table 5 shows that the top 5 DRSpaces of any of the three projects, within any of Bug2, Bug5, or Bug10, can capture more than half of the error-prone files within each bug space. The top 10 DRSpaces can cover from 57% to 92% of a bug space. In summary, the answer to the second research question is yes, most error-prone files are concentrated in a few DRSpaces.

Figure 8:
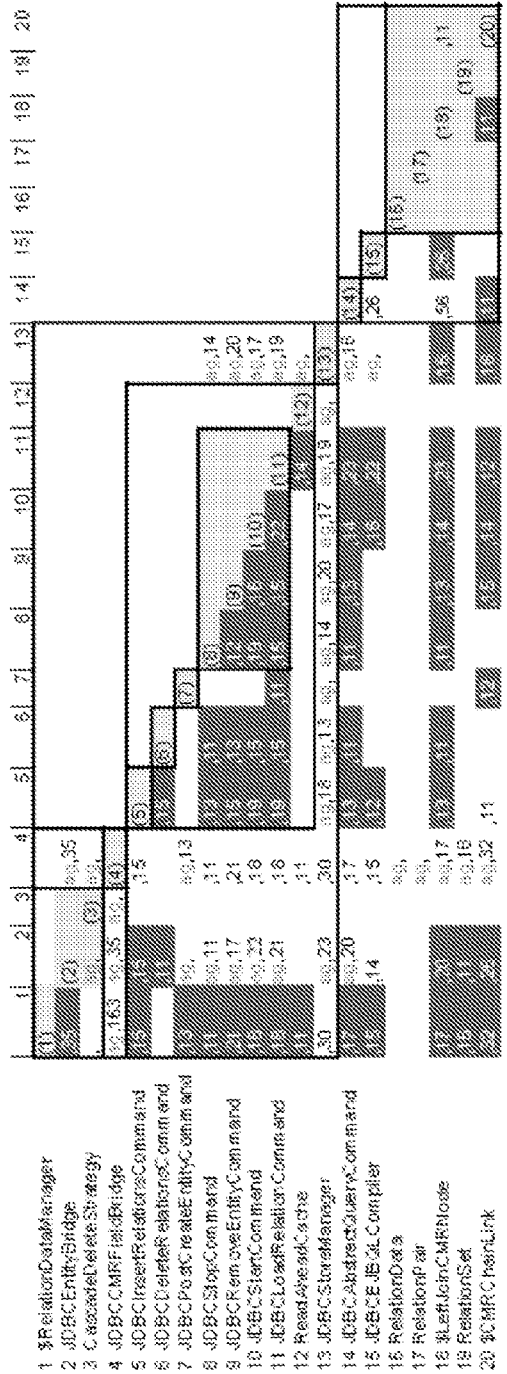
FIG. 8 is an illustration of an example depiction of a DRSpace.

The structure of effort-prone spaces is discussed below. The results reported in the previous sections imply that large numbers of error-prone files belong to the same few DRSpaces. The question is whether these DRSpaces can provide insights into the reasons why these files are error-prone. For example, FIG. 8 depicts the DRSpace led by JDBCCMRFieldBridge. This DRSpace was obtained by first clustering the overall DSM using ArchDRH. This file was chosen in the tree view of Titan, and the "Split" button was selected.

This file has 27 bug fixes, and is ranked as the 2nd most error-prone in the project. FIG. 8 shows its DRSpace with only the aggregation relation, together with evolutionary coupling. A pair of files that have no structural relation but only evolutionary coupling are shown as dark background cells with white font. The threshold of evolutionary coupling is set to 10.

The large number of dark cells indicates that there are many modularity violations. These violations can be separated into two categories: 1) the files whose names include Command are always changed together; and 2) the RelationDataManager always changed together with these Command files. This DSM reveals structural issues that violate well-known design principles.

Consider l:(rc5-11), a layer containing all the command classes, and the JDBCStoreManager class. The latter aggregates all the 7 command classes, and is aggregated by 4 of them. This cyclical aggregation relation violates good design principles. It seems that the developers intended to apply a command pattern, but the DSM does not reveal a valid command pattern structure where the client (which in this case seems to be JDBCStoreManager), should only depend on an abstract command interface, rather than on concrete commands. This DSM also shows another aggregation cycle in rc(1-4).

All the error-prone DRSpaces of each project were analyzed, and it was observed that they usually exhibit the following problems.

Aggregation/dependency cycles: once aggregation or dependency as the primary relation was selected, it was found that many error-prone DRSpaces exhibit more than one aggregation or dependency cycle. For example, in the DRSpace led by metadata.JDBCEntityMetaData, there are 4 aggregation cycles. In one of them, JDBCEntityBridge (71st most error-prone) and JDBCCMRFieldBridge(2nd most error-prone) aggregate each other. Different from other tools that can detect cyclic relations, the tools described herein show the penalty of such relations. For example, the tools show that JDBCEntityBridge and JDBCCMRFieldBridge changed together 35 times. Furthermore, it should be noted that not all cyclical relations are harmful. CascadeDeleteStrategy and JDBCCMRFieldBridge also aggregate each other, but they never changed together, and CascadeDeleteStrategy has no bug fixes. A tool that simply identifies cyclic relations cannot distinguish between harmful and harmless cases.

As another example, FSNamesystem has 190 bug fixes and is ranked as the number 1 most error-prone file in HADOOP. From its DRSpace with 17 files, it can be seen that FSNamesystem is involved in a dependency cycle with 11 files, and an aggregation cycle with 7 elements.

Problematic inheritance hierarchy. Inheritance issues manifest themselves in different ways, including parent and children frequently changing together, a client inheriting a parent class while aggregating its child, a parent depending on one of its children, etc. FIG. 9 shows the inheritance DRSpace of FileSystem (ranked the 13th most error-prone). This space was obtained by first clustering the DRSpace using inheritance as the primary relation. After that, dependency as the secondary relation was shown when it was seen that FileSystem depends on one of its children, DistributedFileSystem. After choosing evolutionary coupling as another secondary relation, it can be seen that these two files changed together 26 times, while the other elements within the same space changed together 5 to 10 times.

FIG. 9 also depicts a representative example where problematic co-changes may not be modularity violations: Titan didn't mark the relation between DistributedFileSystem and FileSystem as a violation because they do have structure relations. However, the fact that they are changed together unusually frequently and that they have both inheritance and dependency relations, indicates that there is definitely something wrong.

As another example, JobTracker in HADOOP is ranked most error-prone with 165 bug fixes. In its inheritance DRSpace, after choosing dependency and aggregation as secondary relations, it was observed that JobTracker depends on conf.Configuration, and aggregates mapred.JobConf, which, in turn, is a child of conf.Configuration. Both mapred.JobConf and conf.Configuration are highly buggy, ranking 21st and 26th respectively. They both lead large error-prone DRSpaces, with 76 and 54 files respectively. Since JobTracker either depends on or aggregates them, it is not surprising that it is the most error-prone file of the entire project.

It was observed that each error-prone DRSpace has more than one type of structural issue. They were considered problematic because they violate common design principles, and the files involved in these structural problems are both highly error- and change-prone.

Thus, with respect to RQ1 if a file is error-prone itself, and leading a non-trivial DRSpace that is relatively highly coupled, then a significant number of the files within its DRSpace are also error-prone. With respect to RQ2, although each project may have hundreds of error-prone files, these files are often captured by just a few DRSpaces. In all projects studied with all three types of bug spaces, the 5 largest DRSpaces captured more than half of the files in the bug space. With respect to RQ3, by examining DRSpaces with different types of primary and secondary relations, it was found that all error-prone DRSpaces have more than one structural problem that violate commonly accepted design principles. The most prominent problems include large dependency or aggregation cycles, problematic inheritance hierarchies, the aggregation or inheritance of highly error-prone files, and the existence of potential shared secrets.

As described herein, design rule spaces, are a new form of architecture representation that uniformly captures both architecture and evolution relations using design structure matrices. As discussed, software architectures should be viewed and analyzed as multi-layered overlapping DRSpaces, because each DRSpace, formed using different types of primary and secondary relations, exhibits meaningful and useful modular structures. Each of these structures promotes and supports a different kind of analysis.

To bridge the gap between architecture and defect prediction, the relationships between DRSpaces and bug spaces were studied in three large-scale open source projects. The results showed that error-prone files usually lead to error-prone DRSpaces in which most of the files are also error-prone, and that a few error-prone DRSpaces can capture large portion of error-prone files. By viewing different DRSpaces of the same architecture, formed and complemented by different types of relations, a large number of structural and evolutionary problems were identified that may contribute to the root cause—the architectural cause—of bugginess. This analysis can aid the architect in determining when and how these error-prone files should be fixed.

DRSpaces have the potential to change how software architecture is viewed, modeled, and analyzed, and to bridge the gap between architecture and defect prediction by not only locating error-prone files, but also providing refactoring suggestions.

In an example embodiment, a design rule space and applications thereof as described herein may reside on and/or be implemented via an apparatus. The apparatus may comprise a processor and memory coupled to the processor. The memory may comprise executable instructions that when executed by the processor cause the processor to effectuate operations associated with a design rule space as described herein.

Figure 15:
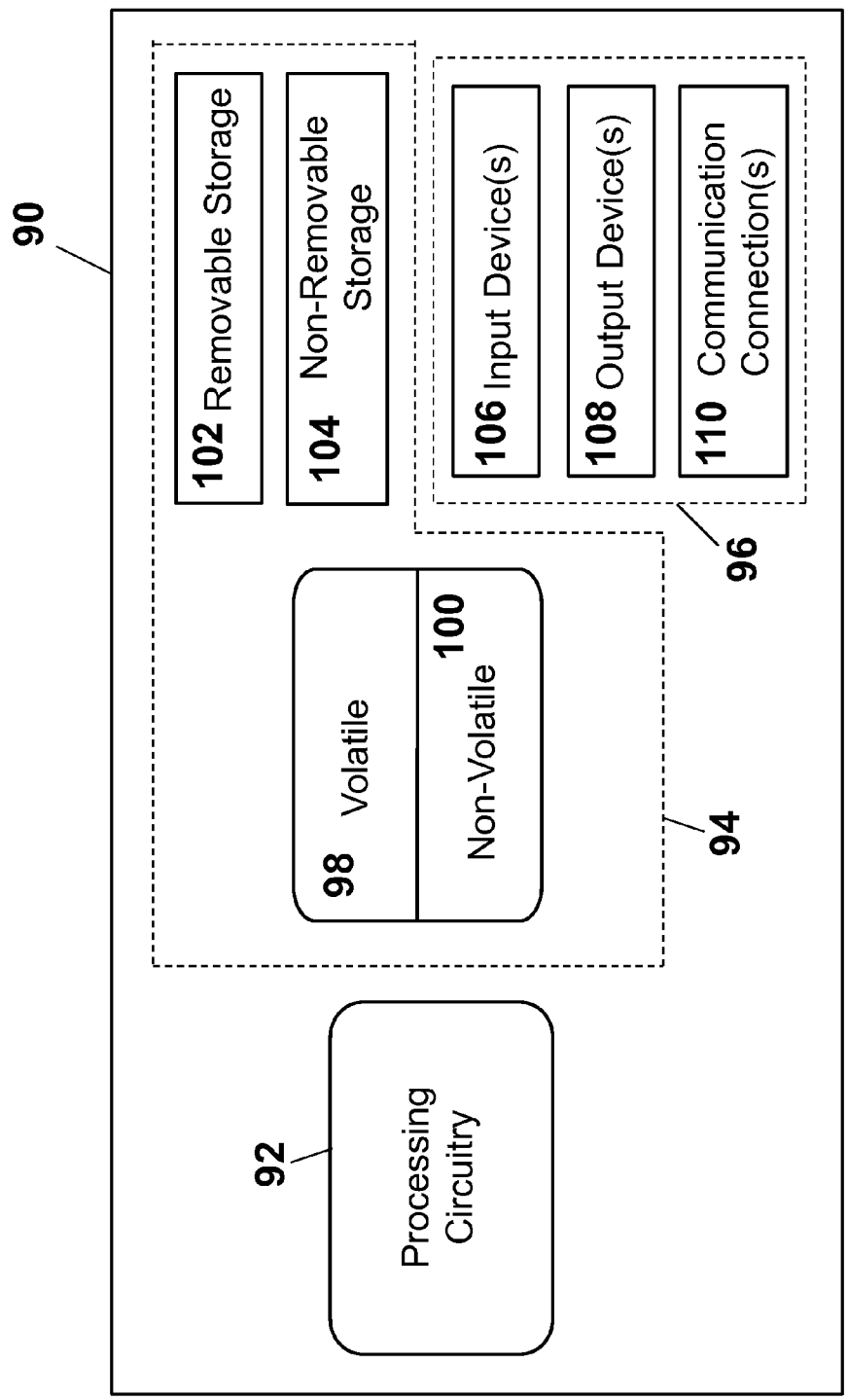
FIG. 15 is a block diagram of an example processor for effectuating error detection.

FIG. 15 is a block diagram of an example processor 90 for implementing error detection utilizing a design rule space, architecture root detection, or any appropriate combination thereof, as described herein. The processor 90 may comprise hardware or a combination of hardware and software. In an example embodiment, the functionality to facilitate error detection, as described herein, may reside in any one or combination of processors. The processor 90 depicted in FIG. 15 may represent and perform functionality of any appropriate processor, or combination of processor. It is emphasized that the block diagram depicted in FIG. 15 is exemplary and not intended to imply a specific implementation or configuration. Thus, the processor 90 may be implemented in a single device or multiple devices (e.g., single processor or multiple processors, single server or multiple servers, single controller or multiple controllers, etc.). Multiple processors may be distributed or centrally located. Multiple processor may communicate wirelessly, via hard wire, or any appropriate combination thereof.

The processor 90 may comprise and/or be incorporated into any appropriate processor or the like, examples of which may include a computer, a laptop, a tablet, a desktop, a server, a blade, a controller, a mobile device, a mobile communications device, a cellular phone, a portable computing device, a personal digital assistant ("PDA"), a portable phone (e.g., a cell phone or the like, a smart phone, a video phone), a portable email device, a portable gaming device, a TV, a DVD player, portable media player, (e.g., a portable music player, such as an MP3 player, a Walkman, etc.), a portable navigation device (e.g., GPS compatible device, A-GPS compatible device, etc.), or any appropriate combination thereof.

In an example embodiment, the processor 90 may comprise a processor and memory coupled to the processor. The memory may comprise executable instructions that when executed by the processor cause the processor to effectuate operations associated with error detection, as described herein. As evident from the herein description the processor 90 is not to be construed as software per se.

In an example configuration, the processor 90 may comprise a processing portion 92, a memory portion 94, and an input/output portion 96. The processing portion 92, memory portion 94, and input/output portion 96 may be coupled together (coupling not shown in FIG. 15) to allow communications therebetween. Each portion of the processor 90 may comprise circuitry for performing functions associated with each respective portion. Thus, each portion may comprise hardware, or a combination of hardware and software. Accordingly, each portion of the processor 90 is not to be construed as software per se. The input/output portion 96 may be capable of receiving and/or providing information from/to a communications device and/or other processer in order to effectuate error detection as described herein. For example, the input/output portion 96 may include a wireless communications (e.g., 2.5G/3G/4G/GPS) card. The input/output portion 96 may be capable of receiving and/or sending video information, audio information, control information, image information, data, or any combination thereof. In an example embodiment, the input/output portion 96 may be capable of receiving and/or sending information to determine a location of the processor 90 and/or the communications processor 90. In an example configuration, the input/output portion 96 may comprise a GPS receiver. In an example configuration, the processor 90 may determine its own geographical location and/or the geographical location of a communications device through any type of location determination system including, for example, the Global Positioning System (GPS), assisted GPS (A-GPS), time difference of arrival calculations, configured constant location (in the case of non-moving devices), any combination thereof, or any other appropriate means. In various configurations, the input/output portion 96 may receive and/or provide information via any appropriate means, such as, for example, optical means (e.g., infrared), electromagnetic means (e.g., RF, WI-FI, BLUETOOTH, ZIGBEE, etc.), acoustic means (e.g., speaker, microphone, ultrasonic receiver, ultrasonic transmitter), or a combination thereof. In an example configuration, the input/output portion may comprise a WIFI finder, a two way GPS chipset or equivalent, or the like, or a combination thereof.

The processing portion 92 may be capable of performing functions associated with error detection as described herein. For example, the processing portion 92 may be capable of, in conjunction with any other portion of the processor 90, installing an application for error detection as described herein.

In a basic configuration, the processor 90 may include at least one memory portion 94. The memory portion 94 may comprise a storage medium having a concrete, tangible, physical structure. As is known, a signal does not have a concrete, tangible, physical structure. Therefore, memory portion 94, as well as any computer-readable storage medium described herein, is not to be construed as a signal. The memory portion 94, as well as any computer-readable storage medium described herein, is not to be construed as a transient signal. The memory portion 94, as well as any computer-readable storage medium described herein, is not to be construed as a propagating signal. The memory portion 94, as well as any computer-readable storage medium described herein, is to be construed as an article of manufacture.

The memory portion 94 may store any information utilized in conjunction with error detection as described herein. Depending upon the exact configuration and type of processor, the memory portion 94 may be volatile 98 (such as some types of RAM), non-volatile 100 (such as ROM, flash memory, etc.), or a combination thereof. The processor 90 may include additional storage (e.g., removable storage 102 and/or non-removable storage 104) including, for example, tape, flash memory, smart cards, CD-ROM, digital versatile disks (DVD) or other optical storage, magnetic cassettes, magnetic tape, magnetic disk storage or other magnetic storage devices, universal serial bus (USB) compatible memory, or any other medium which can be used to store information and which can be accessed by the processor 90.

The processor 90 also may contain communications connection(s) 110 that allow the processor 90 to communicate with other devices, processors, network entities, or the like. A communications connection(s) may comprise communication media. Communication media typically embody computer readable instructions, data structures, program modules or other data in a modulated data signal such as a carrier wave or other transport mechanism and includes any information delivery media. By way of example, and not limitation, communication media may include wired media such as a wired network or direct-wired connection, and wireless media such as acoustic, RF, infrared, and other wireless media. The term computer readable media as used herein includes both storage media and communication media. The processor 90 also may include input device(s) 106 such as keyboard, mouse, pen, voice input device, touch input device, etc. Output device(s) 108 such as a display, speakers, printer, etc. also may be included.

The example embodiments of error detection described herein may be utilized in connection with various computing devices/processors. The underlying concepts of error detection may be applied to any computing device, processor, or system capable of generating, implementing and/or facilitating implementation of error detection as described herein. The various techniques described herein may be implemented in connection with hardware or software or, where appropriate, with a combination of both. Thus, the methods and apparatuses for effectuating error detection, or certain aspects or portions thereof, can take the form of program code (i.e., instructions) embodied in concrete, tangible, storage media having a concrete, tangible, physical structure. Examples of tangible storage media include floppy diskettes, CD-ROMs, DVDs, hard drives, or any other tangible machine-readable storage medium (computer-readable storage medium). Thus, a computer-readable storage medium as described herein has a concrete, tangible, physical structure, and thus is not a signal because a signal does not have a concrete, tangible, physical structure. A computer-readable storage medium as described here is not a transient signal. Further, a computer-readable storage medium as described herein is not a propagating signal. A computer-readable storage medium as described herein is an article of manufacture. When the program code is loaded into and executed by a machine, such as a computer, the machine becomes an apparatus for generating, implementing, and/or facilitating implementation of a design rule space as described herein. In the case of program code execution on programmable computers, the computing device will generally include a processor, a storage medium readable by the processor (including volatile and non-volatile memory and/or storage elements), at least one input device, and at least one output device. The program(s) can be implemented in assembly or machine language, if desired. The language can be a compiled or interpreted language, and combined with hardware implementations.

The methods and apparatuses for effectuating error detection as described herein also may be practiced via communications embodied in the form of program code that is transmitted over some transmission medium, such as over electrical wiring or cabling, through fiber optics, or via any other form of transmission, wherein, when the program code is received and loaded into and executed by a machine, such as an EPROM, a gate array, a programmable logic device (PLD), a client computer, or the like, the machine becomes an apparatus for effectuating error detection as described herein. When implemented on a general-purpose processor, the program code combines with the processor to provide a unique apparatus that operates to invoke the functionality of error detection as described herein.

While error detection utilizing a design rule space, detection of architecture roots, or any appropriate combination thereof, have been described in connection with the various embodiments of the various figures, it is to be understood that other similar embodiments may be used or modifications and additions may be made to the described embodiments of error detection without deviating therefrom. Therefore, error detection utilizing a design rule space, detection of architecture roots, or any appropriate combination thereof, as described herein should not be limited to any single embodiment, but rather should be construed in breadth and scope in accordance with the appended claims.

What is claimed:

1. A method comprising:
analyzing a plurality of design rule spaces, each of the design rule spaces comprising a dependency graph having vertices indicative of a plurality of files, wherein:
edges of the dependency graph are indicative of relationships between files of the plurality of files;
at least one of the relationships between the files of the plurality of files is indicative of a primary relation; and
the dependency graph is indicative of a design rule hierarchy based on at least one primary relation;
determining an error proneness of the plurality of files;
determining that at least two of the plurality of files have an error proneness that exceeds a threshold;
determining, based on the analyzing of the plurality of design rule spaces and the determined error proneness of the two or more of the plurality of files, a number of design rule spaces needed to cover the two or more of the plurality files; and
visually rendering an indication of the relationship between the two or more of the plurality of files.

2. The method of claim 1, wherein:
edges of the dependency graph are indicative of a coupling of files of the plurality of files derived from a revision history.

3. The method of claim 1, wherein:
at least one of the relationships between the files of the plurality of files is indicative of a secondary relation.

4. The method of claim 1, further comprising:
determining, based on the analyzing of the dependency graph and the determined error proneness of the plurality of files, structural relations among error prone files of the plurality of files.

5. The method of claim 1, further comprising:
determining, based on the analyzing of the dependency graph and the determined error proneness of the plurality of files, structural problems contributing to error proneness.

6. The method of claim 1, further comprising:
determining, based on the analyzing of the dependency graph and the determined error proneness of the plurality of files, a bugginess among error prone files.

7. The method of claim 1, further comprising:
determining, based on the analyzing of the dependency graph and the determined error proneness of the plurality of files, structural problems contributing to bugginess.

8. An apparatus comprising:
a processor; and
memory coupled to the processor, the memory comprising executable instructions that when executed by the processor cause the processor to effectuate operations comprising:
analyzing a plurality of design rule spaces, each of the design rule spaces comprising a dependency graph having vertices indicative of a plurality of files, wherein:
edges of the dependency graph are indicative of relationships between files of the plurality of files;
at least one of the relationships between the files of the plurality of files is indicative of a primary relation; and
the dependency graph is indicative of a design rule hierarchy based on at least one primary relation;
determining an error proneness of the plurality of files;
determining that at least two of the plurality of files have an error proneness that exceeds a threshold;
determining, based on the analyzing of the plurality of design rule spaces and the determined error proneness of the two or more of the plurality of files, a number of design rule spaces needed to cover the two or more of the plurality files; and
visually rendering an indication of the relationship between the two or more of the plurality of files.

9. The apparatus of claim 8, wherein:
edges of the dependency graph are indicative of a coupling of files of the plurality of files derived from a revision history.

10. The apparatus of claim 8, wherein:
at least one of the relationships between the files of the plurality of files is indicative of a secondary relation.

11. The apparatus of claim 8, the operations further comprising:
determining, based on the analyzing of the dependency graph and the determined error proneness of the plurality of files, structural relations among error prone files.

12. The apparatus of claim 8, the operations further comprising:
determining, based on the analyzing of the dependency graph and the determined error proneness of the plurality of files, structural problems contributing to error-proneness.

13. The apparatus of claim 8, the operations further comprising:
determining, based on the analyzing of the dependency graph and the determined error proneness of the plurality of files, bugginess among error prone files.

14. The apparatus of claim 8, the operations further comprising:
 determining, based on the analyzing of the dependency graph and the determined error proneness of the plurality of files, structural problems contributing to bugginess.

15. A computer-readable storage medium comprising executable instructions that when executed by a processor cause the processor to effectuate operations comprising:
 analyzing a plurality of design rule spaces, each of the design rule spaces comprising a dependency graph having vertices indicative of a plurality of files, wherein:
  edges of the dependency graph are indicative of relationships between files of the plurality of files;
  at least one of the relationships between the files of the plurality of files is indicative of a primary relation; and
  the dependency graph is indicative of a design rule hierarchy based on at least one primary relation;
 determining an error proneness of the plurality of files;
 determining that at least two of the plurality of files have an error proneness that exceeds a threshold;
 determining, based on the analyzing of the plurality of design rule spaces and the determined error proneness of the two or more of the plurality of files, a number of design rule spaces needed to cover the two or more of the plurality files; and
 visually rendering an indication of the relationship between the two or more of the plurality of files.

16. The computer-readable storage medium of claim 15, wherein:
 edges of the dependency graph are indicative of a coupling of files of the plurality of files derived from a revision history.

17. The computer-readable storage medium of claim 15, the operations further comprising:
 at least one of the relationships between the files of the plurality of files is indicative of a secondary relation.

18. The computer-readable storage medium of claim 15, the operations further comprising:
 determining, based on the analyzing of the dependency graph and the determined error proneness of the plurality of files, structural relations among error prone files.

19. The computer-readable storage medium of claim 15, the operations further comprising:
 determining, based on the analyzing of the dependency graph and the determined error proneness of the plurality of files, structural problems contributing to error-proneness.

20. The computer-readable storage medium of claim 15, the operations further comprising:
 determining, based on the analyzing of the dependency graph and the determined error proneness of the plurality of files, bugginess among error prone files.

21. The computer-readable storage medium of claim 15, the operations further comprising:
 determining, based on the analyzing of the dependency graph and the determined error proneness of the plurality of files, structural problems contributing to bugginess.

\* \* \* \* \*